(12) United States Patent
Paul et al.

(10) Patent No.: US 6,882,525 B2
(45) Date of Patent: Apr. 19, 2005

(54) UNIVERSAL RECEPTACLES FOR INTERCHANGEABLY RECEIVING DIFFERENT REMOVABLE COMPUTER DRIVE CARRIERS

(75) Inventors: Dieter G. Paul, Anaheim, CA (US); Choon-Tak Tang, Irvine, CA (US)

(73) Assignee: StorCase Technology, Inc., Fountain Valley, CA (US)

( * ) Notice: Subject to any disclaimer, the term of this patent is extended or adjusted under 35 U.S.C. 154(b) by 129 days.

(21) Appl. No.: 10/375,471

(22) Filed: Feb. 27, 2003

(65) Prior Publication Data

US 2004/0169996 A1 Sep. 2, 2004

(51) Int. Cl.[7] .................................................. G06F 1/16
(52) U.S. Cl. .................... 361/685; 361/695; 312/223.2; 439/928.1
(58) Field of Search ................................ 361/685, 687, 361/688, 694, 695, 690, 715, 725–727; 312/223.1–223.2; 439/928.1

(56) References Cited

U.S. PATENT DOCUMENTS 6,034,868 A * 3/2000 Paul ........................... 361/684
6,111,755 A * 8/2000 Park ........................... 361/727
6,473,297 B1 * 10/2002 Behl et al. ................... 361/685

* cited by examiner

Primary Examiner—Hung Van Duong
(74) Attorney, Agent, or Firm—Morland C. Fischer

(57) ABSTRACT

A universal receiving frame to be mounted in a drive bay of a chassis or storage enclosure that is interfaced with a host computer. The universal receiving frame is capable of interchangeably receiving different removable computer drive carriers having respective remote computer drives that are configured for parallel and serial operation. A printed circuit board is mounted on the back wall of the universal receiving frame in which an incoming removable drive carrier is slidably received. A suitable (e.g. a Serial ATA) interface and a serial-to-parallel bridge are located on the printed circuit board of the frame, whereby different removable carriers, regardless of drive configuration, can communicate with the chassis by way of the same receiving frame. In an alternate embodiment, which eliminates the universal receiving frame, the removable carriers are connected to one side of a backplane within the chassis and pull-out peripheral circuit boards are connected to the opposite side. A serial-to-parallel bridge is mounted on each of the removable carriers and a serial-to-serial or serial-to-parallel converter is mounted on each of the peripheral circuit boards.

13 Claims, 7 Drawing Sheets

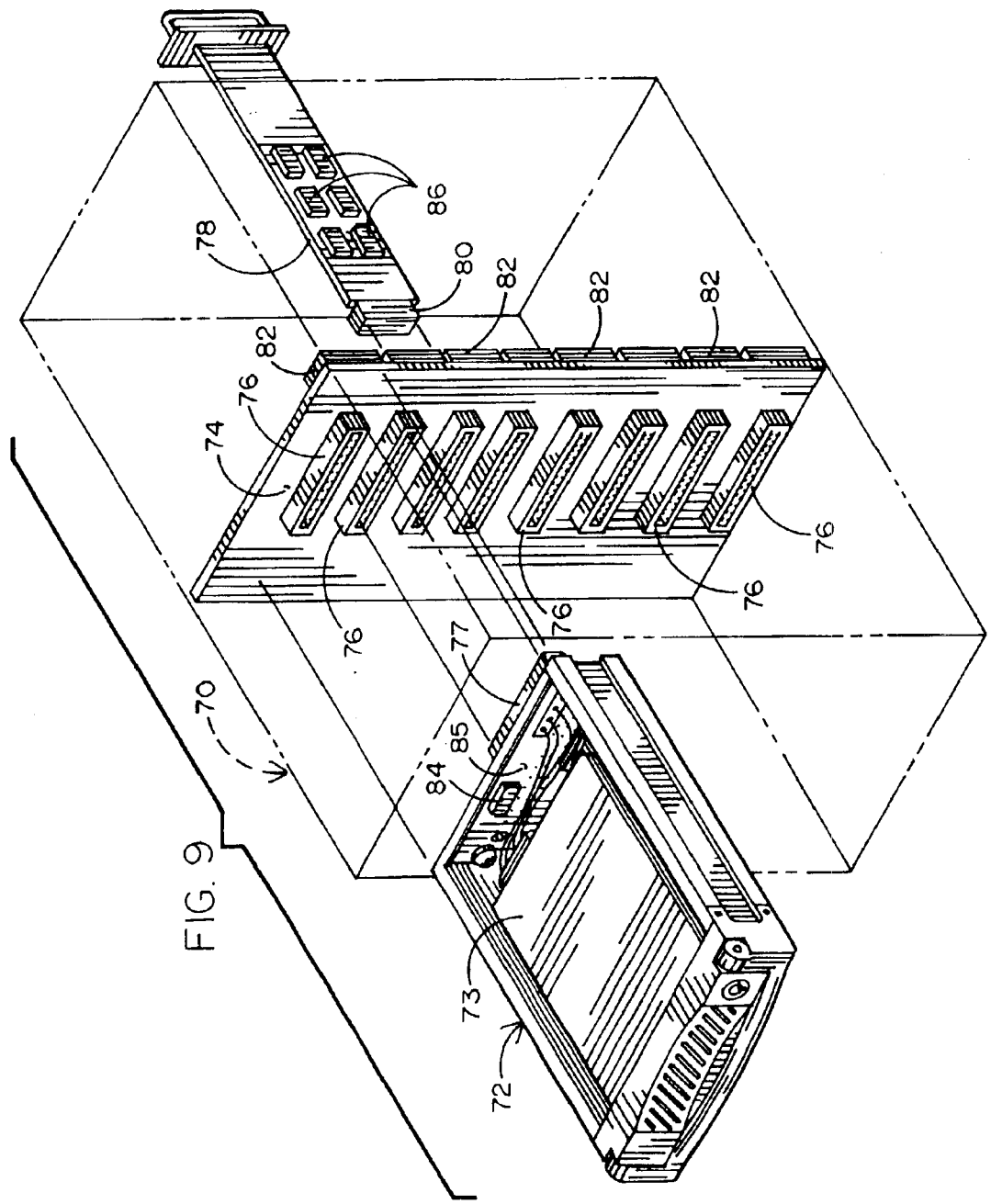

UNIVERSAL RECEPTACLES FOR INTERCHANGEABLY RECEIVING DIFFERENT REMOVABLE COMPUTER DRIVE CARRIERS

BACKGROUND OF THE INVENTION

1. Field of the Invention

This invention relates to receptacles by which different removable carriers having portable computer drives connected for either serial or parallel operation can be interchangeably received within the same chassis or storage enclosure so as to be interfaced with a host computer without having to make alterations to the computer drives or the chassis.

2. Background Art

With the advent of personal computers and workstations, it is often necessary to remove the medium on which computer data is stored. For example, it may be desirable to remove a storage medium so as to be carried to a different site and/or to a different computer system. It may also be desirable to remove the storage medium to a secure location when the computer data that is stored thereon is particularly sensitive or secret. To accomplish the foregoing, computer storage media (e.g. disc drives) have been affixed to carriers that are removably received within a storage enclosure or chassis that is located remotely from a host computer. The removable carrier with its portable computer drive is simply pulled out of the chassis on an as-needed basis. Either the original disc drive carrier or a different carrier can be returned to the chassis. This insertion/removal cycle of the carrier usually occurs numerous times throughout the workday.

As will be known to those skilled in the art, each time that the removable carrier is inserted within its chassis, the computer drive that is affixed thereto must be electrically interfaced with the host computer by way of a plurality of interface connectors. In some cases, the portable computer drive that is enclosed by the removable carrier is connected for serial operation. In other cases, the computer drive is connected for parallel operation. Consequently, different removable carriers in which serially and parallel connected computer drives are enclosed cannot be inserted in the same drive bay of the chassis unless alterations are first made to the chassis or to the portable computer drives. Such alterations would typically increase the cost and complexity of the computer system and the remote storage means associated therewith.

Accordingly, it would be desirable to enable different removable computer drive carriers to be interchangeably inserted into the same drive bay of a chassis regardless of whether the computer drive thereof is connected for serial or parallel operation and without having to make alteration to the chassis and/or to the drive.

SUMMARY OF THE INVENTION

A universal receiving frame according to a first embodiment of this invention is disclosed to be mounted in a drive bay of a chassis or storage enclosure that is interfaced with a host computer. The universal receiving frame is configured so as to be automatically adapted to interchangeably receive different removable computer drive carriers regardless of whether the portable computer (e.g. disc) drive thereof is connected for serial or parallel operation. The ability of a single receiving frame to automatically accommodate different removable carriers and both serially and parallel connected computer drives maximizes the flexibility of the computer system and avoids the necessity of having to make alterations to the chassis and/or the portable computer drives.

The universal receiving frame of this embodiment includes a U-shaped body having a back wall, a pair of side walls and an open front to slidably receive a removable carrier in which either a serial or parallel connected computer drive is housed. A multi-pin backplane connector is mounted on and faces inwardly from the back wall of the U-shaped body so as to be mated to the backplane interface connector of an incoming removable carrier. A printed circuit board that is electrically connected to the multi-pin connector is mounted on and faces outwardly from the back wall of the U-shaped body. A DC power connector and a suitable (e.g. a Serial ATA, parallel ATA, SCSI, Serial Attached SCSI (SAS), or the like) interface are carried on the outwardly facing printed circuit board. In accordance with the present improvement, and to provide the universal receiving frame with the capability of interchangeably receiving different removable carriers having either a serial or parallel connected computer drive, a serial-to-parallel bridge is provided. The serial-to-parallel bridge is implemented as an integrated circuit chip that is connected to the circuit board at the back wall of the universal receiving frame without requiring space consuming wires or cables to be interfaced with the chassis in which the frame is located. In an alternate embodiment, the serial-to-parallel bridge is connected to a circuit board that is mounted on the back wall of the removable carrier.

In another embodiment of this invention, a chassis or storage enclosure is automatically adapted to interchangeably receive different computer drive carriers without the inclusion of the aforementioned universal receiving frame. A plurality of removable carriers are stacked one above the other and detachably connected to one side of a backplane located within the chassis. A corresponding plurality of pull-out peripheral circuit boards are detachably connected to the opposite side of the backplane so as to be interconnected with respective ones of the portable drives within the removable carriers. In this case, the serial-to-parallel bridge is connected to the circuit board that is mounted on the back wall of each removable carrier, and a serial-to-serial or serial-to-parallel converter is mounted on each peripheral circuit board.

BRIEF DESCRIPTION OF THE DRAWINGS

FIG. 9 is an exploded view illustrating the detachable connection of a removable carrier and a pull-out peripheral circuit board at opposite sides of a backplane located within the chassis of FIG. 7.

DETAILED DESCRIPTION

Figure 1:
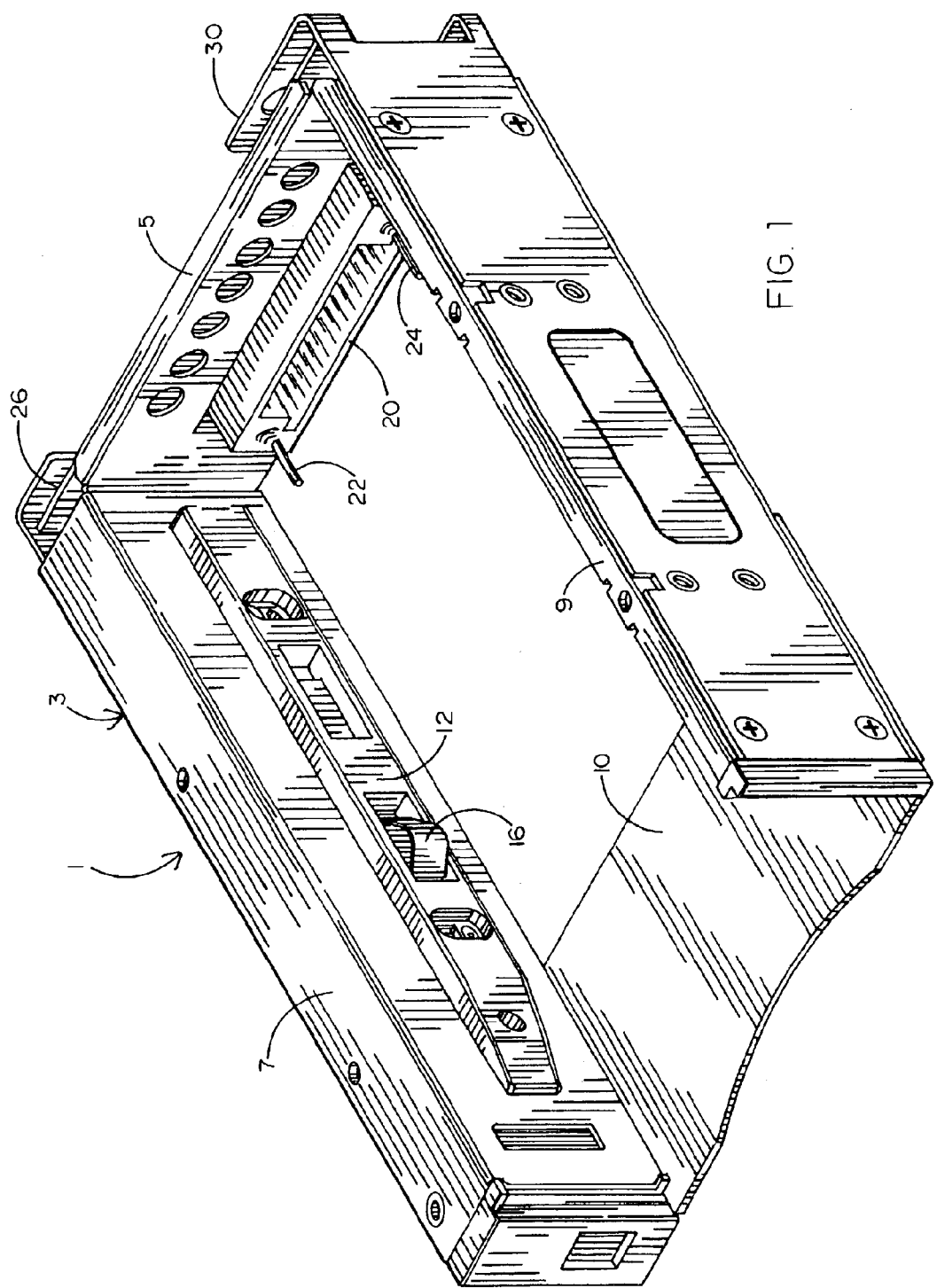
FIG. 1 is a perspective view showing the bottom, side walls and back wall of a universal receiving frame according to one embodiment of this invention.
Figure 2:
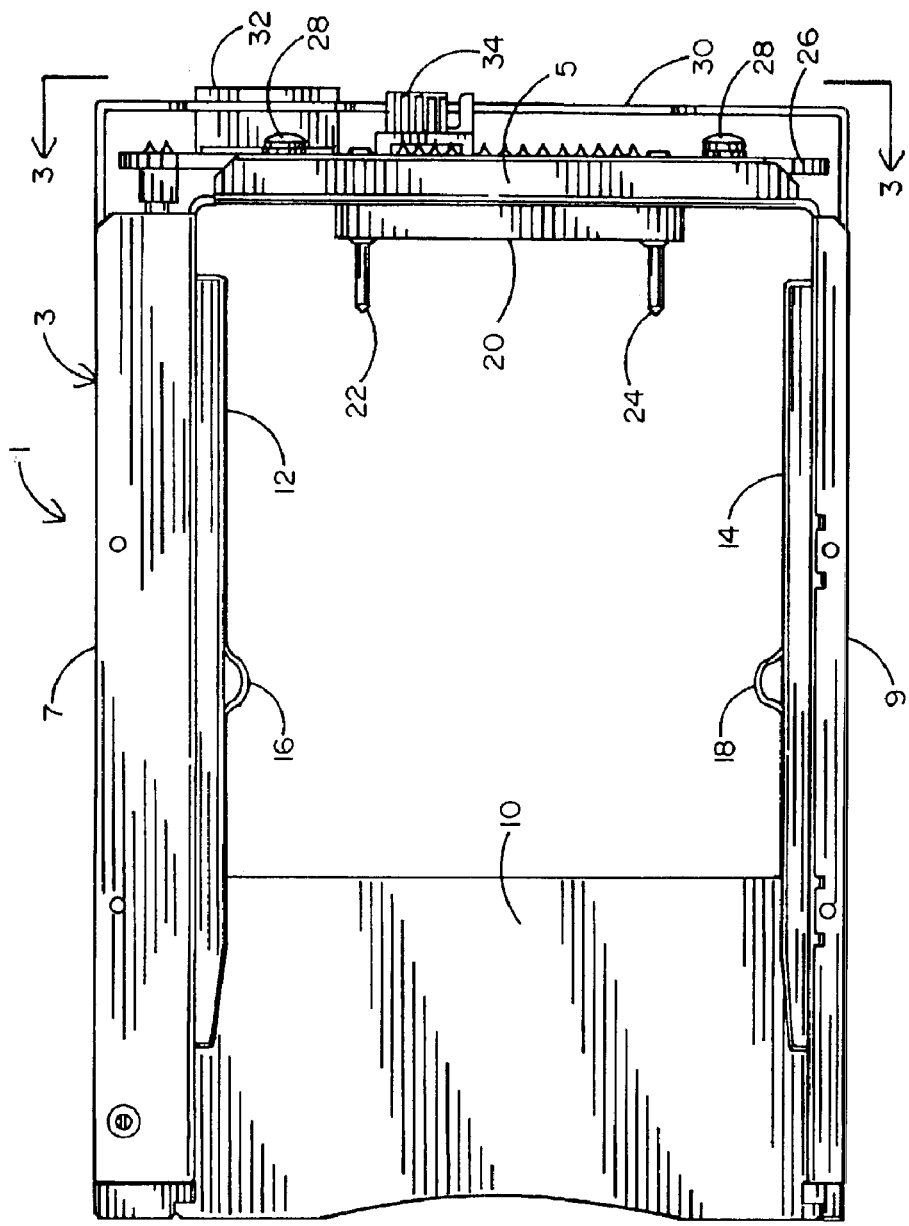
FIG. 2 is a bottom view of the universal receiving frame of FIG. 1.
Figure 3:
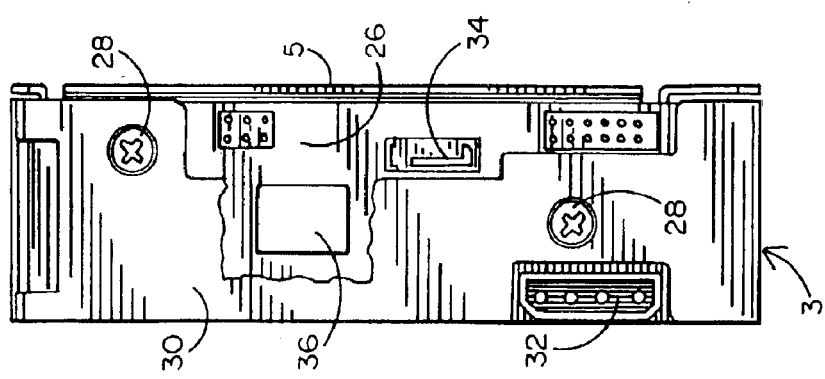
FIG. 3 is a rear end view of the universal frame taken along lines 3—3 of FIG. 2.

Referring initially to FIGS. 1–3 of the drawings, there is shown a universal receiving frame 1 according to a first embodiment of this invention for receiving a removable drive carrier (best shown in FIGS. 4 and 5) of the type in which either one of a serial or parallel connected computer drive is enclosed and transported. The universal receiving frame 1 has a generally U-shaped body 3 that is manufactured from metal and sized to receive and surround a conventional removable carrier. One or more universal receiving frames like that shown in FIG. 1 are typically stacked within respective drive bays of a chassis or storage enclosure in which a corresponding one or a plurality of remote portable computer drives and their removable carriers are housed. In this case, the chassis in which receiving frame 1 is located is separated from a host computer. By way of example, the portable computer drives that are enclosed by respective removable carriers and connected therein for either serial or parallel operation with other computer drives in the chassis are disc drives (designated 42 and 54 in FIGS. 4 and 5). By virtue of the present improvement to be described in greater detail hereinafter, the removable carriers that are interfaced with the serial and parallel connected computer drives thereof are interchangeable with one another in a single receiving frame so as to avoid the necessity for a separate receiving frame and/or chassis to accommodate different carriers having different drive configurations.

The U-shaped body 3 of universal receiving frame 1 includes a back wall 5, a pair of side walls 7 and 9, and an open front by which to slidably receive a removable drive carrier. An overhead platform 10 extends laterally between the side walls 7 and 9 and across the top of the body 3 at the open front thereof to guide an incoming removable carrier into receipt by and detachable connection with the universal receiving frame 1. To this end, guide rails 12 and 14 run longitudinally along the side walls 7 and 9 of the U-shaped body 3 for receipt within corresponding channels formed in the sides of the incoming removable carrier. Metallic springs 16 and 18 project inwardly towards one another from the opposite side walls 7 and 9 of the U-shaped body 3 to establish a conductive link between an incoming removable carrier and the universal receiving frame 1.

Extending axially inward and forwardly from the back wall 5 of the U-shaped body 3 is a serial/parallel low insertion force, high cycle count 75 pin backplane connector 20 (best shown in FIGS. 1 and 2). It is to be understood that the backplane connector 20 may have any suitable number of pins and size so as to be adapted to be mated to the oppositely aligned backplane connectors of the removable carriers having both serial and parallel connected computer drives enclosed therewithin. A pair of locking posts 22 and 24 project from opposite sides of the multi-pin connector 20 of receiving frame 1 to be detachably connected to an incoming removable carrier at receptacles formed in the backplane connector thereof in the manner shown in FIGS. 4 and 5.

Details of the back wall 5 of the U-shaped body 3 of universal receiving frame 1 are best illustrated in FIGS. 2 and 3 where a printed circuit board 26 is shown connected by suitable fasteners (e.g. threaded bolts) 28 to be back wall 5 so as to extend axially outward and rearwardly therefrom. The fasteners 28 are inserted through circuit board 26 and into back wall 5 via holes that are formed in an extension 30 of the side walls 7 and 9 that surrounds and protects the circuit board 26 in spaced relationship with back wall 5. An opening is formed through the bottom of extension 30 to permit access to a DC power connector 32 that is connected to circuit board 26 to provide power to the computer drive. In this same regard, a suitable (e.g. a Serial ATA, parallel ATA, SCSI, Serial Attached SCSI (SAS), or the like) interface 34 extends from circuit board 26 and beyond the extension 30 so that a serial configured computer drive can be interfaced with the chassis in which the universal receiving frame 1 is located.

As an important detail of this invention, and to advantageously provide the universal receiving frame with the capability of interchangeably receiving different removable carriers within which serial or parallel connected computer drives are interfaced, a serial-to-parallel bridge is mounted on the printed circuit board 26. Such a serial-to-parallel bridge functions to convert a parallel configured computer drive to a serial output so that both the parallel and serial drives can be interfaced with the same chassis and host computer by way of the interface 34. In a preferred embodiment, the serial-to-parallel bridge is implemented as an integrated circuit on a semiconductor chip (designated 36 and best shown in FIG. 3) that is electrically connected to circuit board 26 connected to back wall 5 behind extension 30. Integrated circuit chips 36 to implement the serial-to-parallel bridge that is mounted on circuit board 26 at the back wall 5 of universal receiving frame 1 are commercially available. By way of example only, a suitable integrated circuit chip for use in this application is available as Part No. Sil3611 from Silicon Image, Inc. or Part No. 88i8030 from Marvel Semiconductor, Inc.

By mounting both the interface 34 and the serial-to-parallel bridge integrated circuit chip 36 on printed circuit board 26 at the back wall 5 of universal receiving frame 1, the remote computer drive and its chassis are interfaced with one another at the rear of receiving frame 1. Accordingly, the universal receiving frame 1 can be located in a drive bay without requiring additional space consuming wires, cables and the like. Moreover, a single universal receiving frame can automatically accommodate different removable carriers, regardless of whether the remote computer drives thereof are connected for serial or parallel operation. Thus, the same chassis can be interfaced with a host computer despite the differences in the format of the computer drives and without requiring that modifications be made either to the chassis or to the computer drives.

Figure 4:
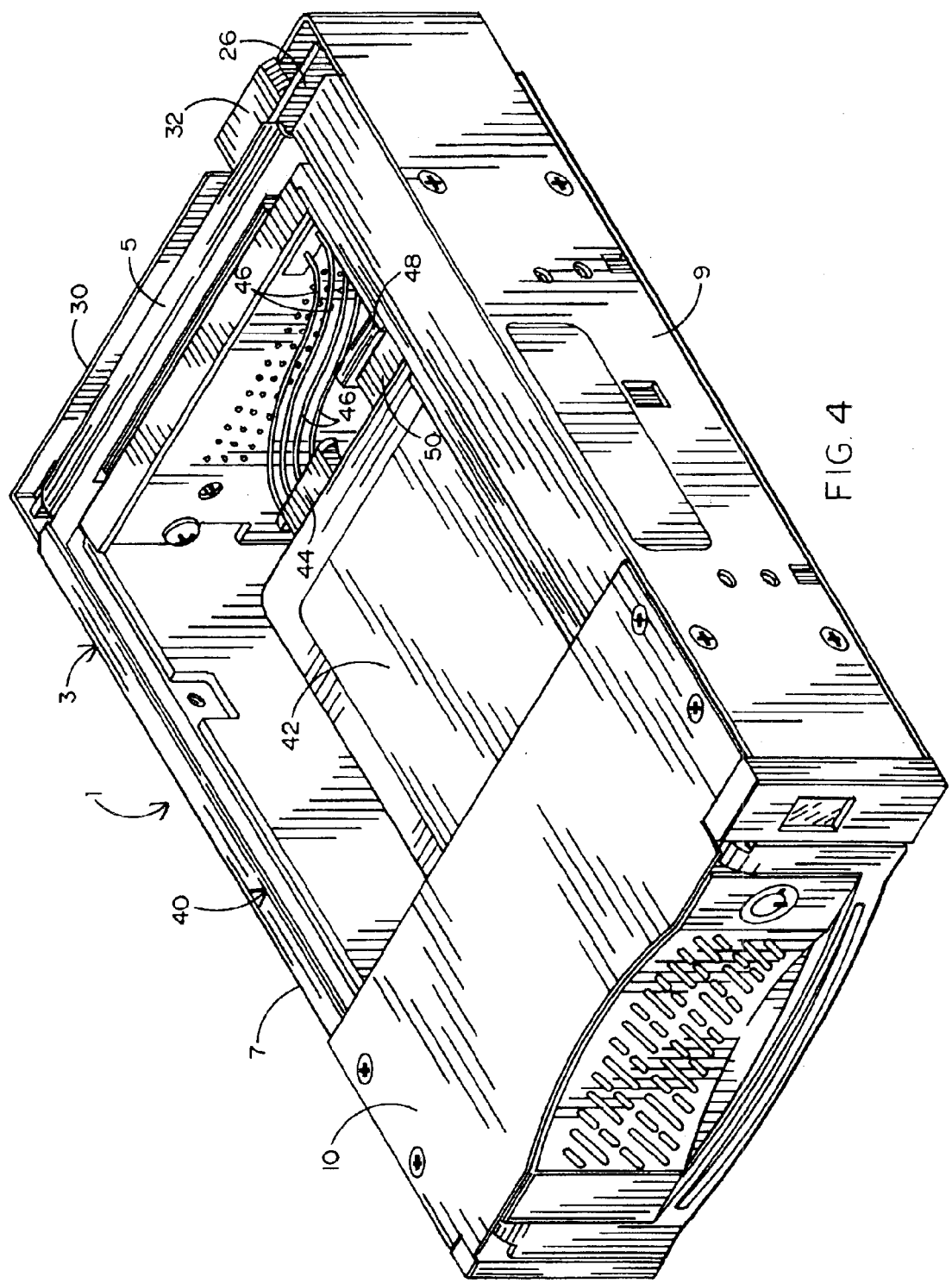
FIG. 4 shows the universal receiving frame of FIG. 1 in receipt of a removable carrier in which a computer drive is connected for parallel operation.

FIG. 4 of the drawings shows a first example of the interchangeable nature of the universal receiving frame 1 of this invention for receiving a removable carrier 40 of the type having a portable computer drive (e.g. a disc drive) 42 that is connected for parallel operation. In this case, the computer drive 42 is electrically connected to an outwardly facing backplane connector interface (not visible) at the backplane of carrier 40 by way of a detachable plug 44 and a set of wires 46. A bus connector 50 from computer drive 42 is detachably connected to an inwardly facing connector 48 that is mounted on the backplane of carrier 40. Inwardly facing connector 50 is also electrically connected to the outwardly facing interface connector at the backplane of carrier 40. The outwardly facing interface connector at the backplane of an incoming removable carrier 40 is detachably connected to the universal receiving frame 1 at the multi-pin backplane connector (designated 20 in FIG. 1) that faces inwardly from the back wall 5 thereof.

Figure 5:
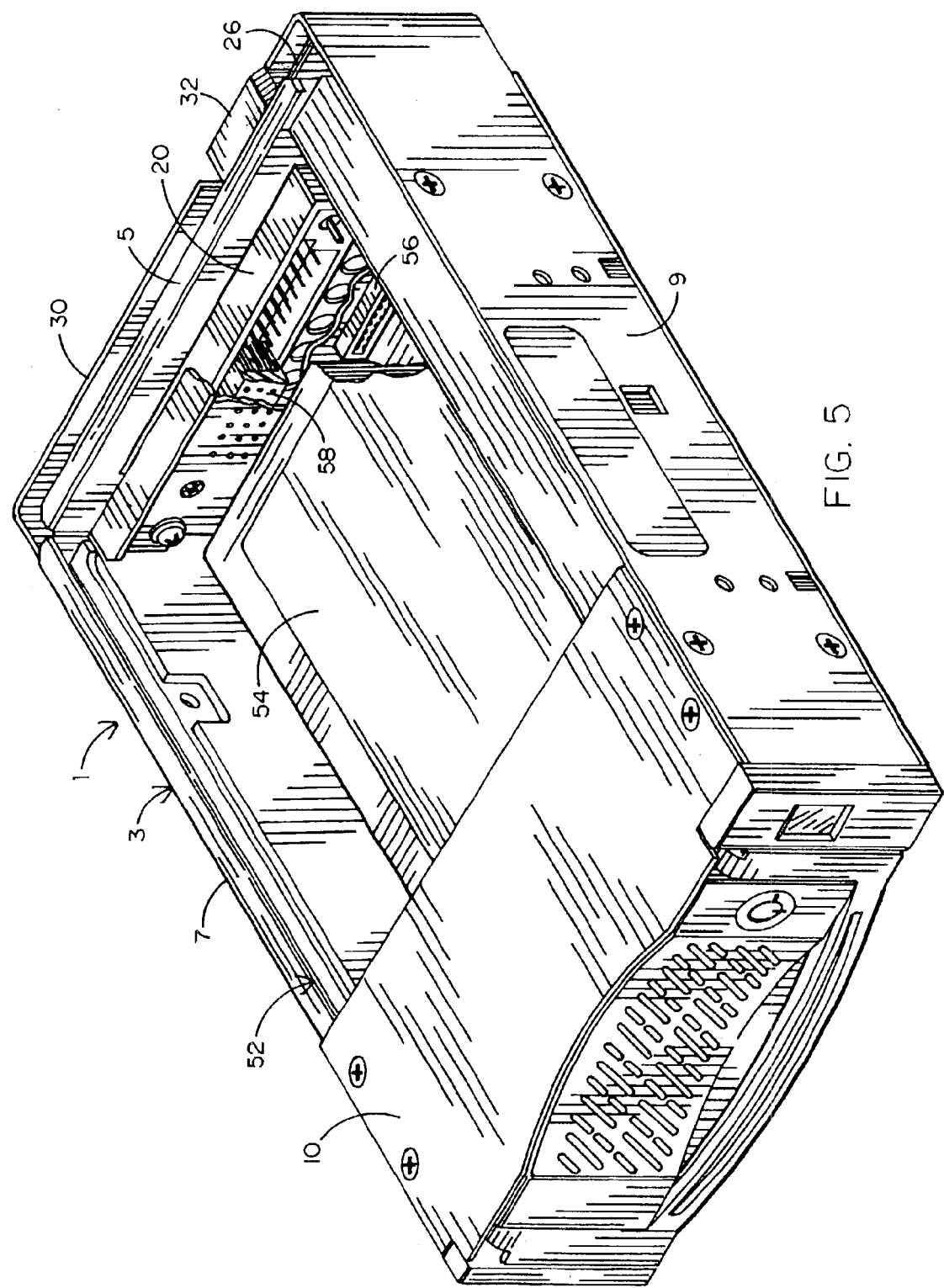
FIG. 5 shows the universal receiving frame of FIG. 1 in receipt of a removable carrier in which a computer drive is connected for serial operation.

FIG. 5 of the drawings shows a second example of the interchangeable nature of the universal receiving frame 1 for receiving a carrier 52 of the type having a portable computer drive (e.g. a disc drive) 54 that is connected for serial operation. In this case, the back of computer drive 54 plugs into a connector 56 that faces inwardly from the backplane of carrier 52. Connector 56 is connected to an outwardly facing interface connector 58 at the backplane of carrier 52. The interface connector 58 of an incoming removable carrier 52 is detachably connected to the universal receiving frame 1 at the multi-pin backplane connector 20 that faces inwardly from the back wall 5 thereof.

Figure 6:
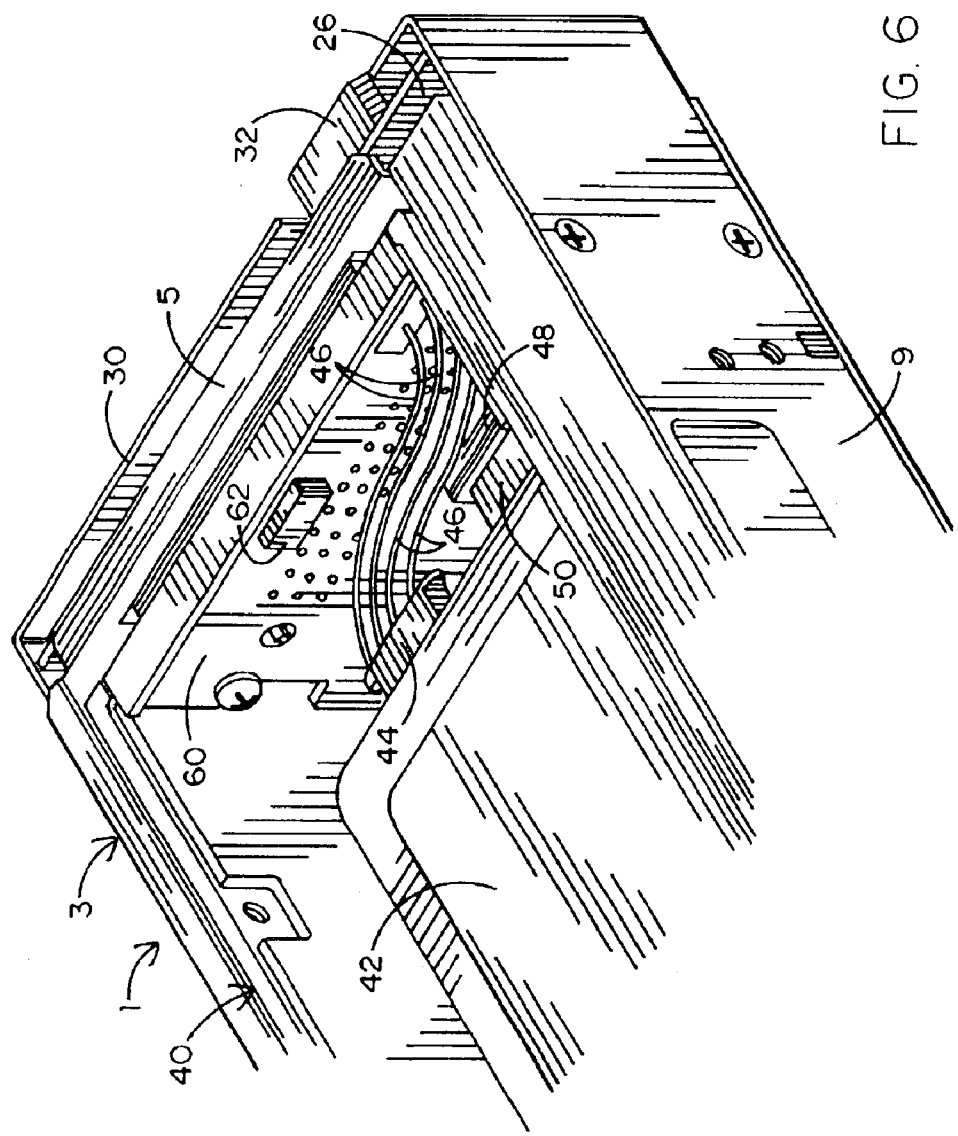
FIG. 6 shows the universal receiving frame of FIG. 1 in receipt of a removable carrier according to a second embodiment of this invention.

In the embodiment of this invention shown in FIGS. 4 and 5, the integrated circuit chip (designated 36 in FIGS. 2 and 3) on which the serial-to-parallel bridge is implemented is located at the back wall 5 of the receiving frame 1. FIG. 6 of the drawings shows an alternate embodiment where the serial-to-parallel bridge is carried by the removable carrier (e.g. 40) rather than the receiving frame 1. In this case, the integrated circuit chip 62 on which the bridge is implemented is connected to a printed circuit board 60 that is mounted on the back wall of carrier 40. The aforementioned interface (designated 34 in FIGS. 2 and 3) remains connected to the circuit board 26 at the back wall 5 of receiving frame 1.

Thus, it can be appreciated that the same universal receiving frame 1 is automatically adapted to slidably receive therewithin the different removable carriers 40 (of FIGS. 4 and 6) and 52 (of FIG. 5) so as to accommodate both the serial and parallel connected computer drives thereof. The foregoing enables a cost and space efficient storage assembly that is capable of using both serial and parallel computer drive technologies within the same chassis. While these improvements have been described as being applicable to remote computer drives that are connected for serial and parallel operation, it is to be understood that the teachings disclosed herein also have application to other drives that are connected in other compatible drive configurations.

In FIGS. 1–6 of the drawings, at least one U-shaped universal receiving frame 1 is shown to be mounted in a drive bay of a chassis or storage enclosure, and a removable drive carrier is slidably received within the universal receiving frame. However, the advantages achieved by this invention are also available without the aforementioned universal receiving frame to couple a removable drive carrier to its chassis. That is, it is within the scope of this invention to connect the drive carrier and the portable computer drive carried therewithin directly to the backplane of the chassis or storage enclosure without the benefit of a receiving frame. Nevertheless, and as will now be explained, the same chassis/storage enclosure can automatically receive different removable drive carriers having remote computer drives that are connected in different drive configurations.

Figure 7:
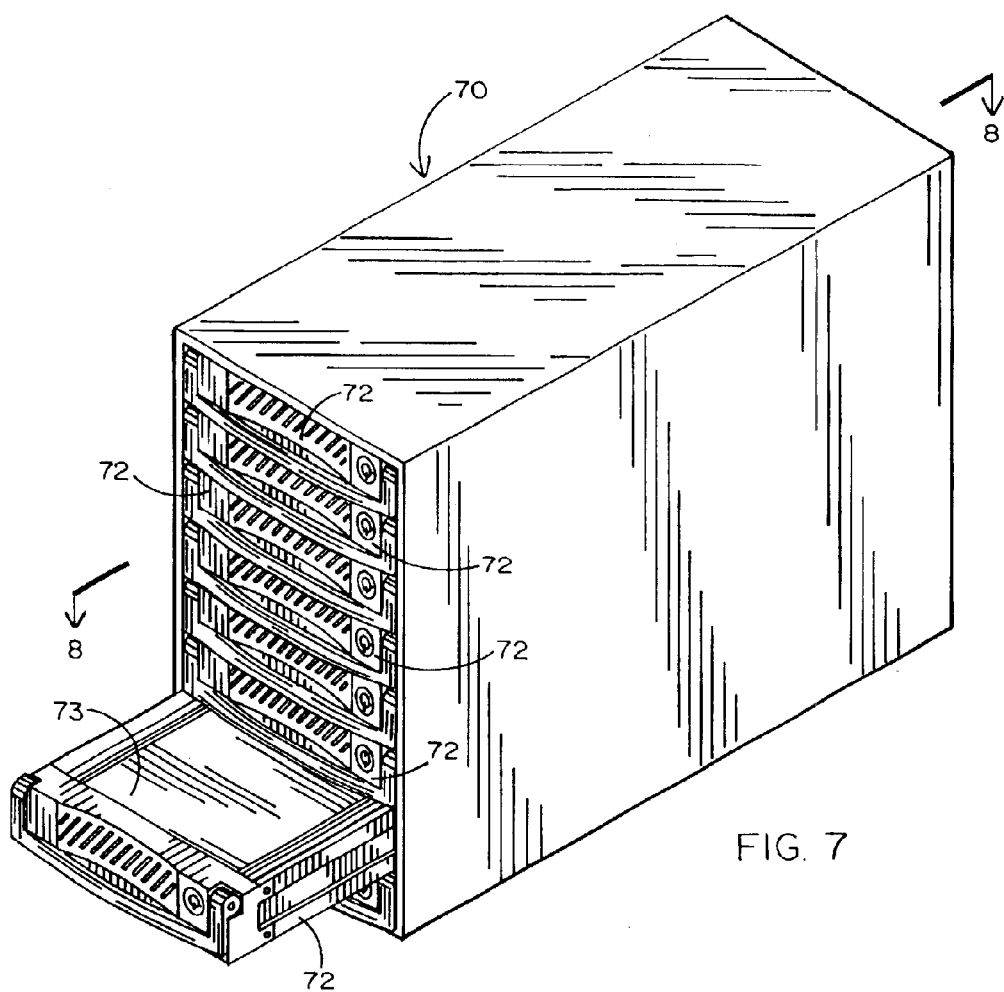
FIG. 7 shows a chassis for interchangeably receiving different removable carriers according to a third embodiment of this invention without requiring the universal receiving frame of FIGS. 1–6.
Figure 8:
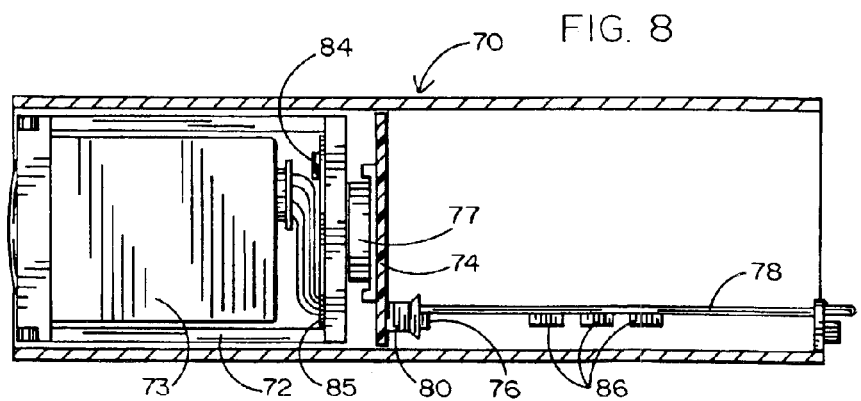
FIG. 8 is a cross-section of the chassis of FIG. 7 taken along lines 8—8 thereof.

In this regard and referring concurrently to FIGS. 7–9 of the drawings, there is shown a chassis 70 within which a plurality of removable drive carriers 72 having remote computer drives 73 are stacked. Although the drive carriers 72 are shown with their computer drives 73 connected for parallel operation, it is to be understood that the computer drives can be connected to operate in other (e.g. serial) drive configurations. Mounted within the chassis 70 is a motherboard commonly referred to as backplane 74 to which the drive carriers 72 are detachably connected. To this end, a set of (e.g. 40 pin) connectors 76 (best shown in FIG. 9) are vertically aligned one above the other at the front of backplane 74 to be mated to complementary plug-in connectors 77 at the rear of respective drive carriers 72. The backplane 74 may have any suitable number of connectors 76 (typically four, eight, twelve or fourteen), such that the chassis 70 will receive therewithin a corresponding number of drive carriers 72. However, the number of connectors 76 on backplane 74 and the number of drive carriers 72 connected thereto and enclosed by chassis 70 are optional and should not regarded as a limitation of this embodiment.

As is best shown in FIG. 9, a pull-out peripheral circuit board 78 having a connector 80 located on a leading edge thereof is detachably connected to the backplane 74 within chassis 70 at a complementary connector 82 at the rear of backplane 74. In some cases, however, the peripheral circuit board 78 may be connected to the front of backplane 74 and then coupled to the rear by means of a cable (not shown). Each peripheral circuit board 78 includes circuitry that enables a computer drive 73 to communicate with external hardware within a computer system.

In the embodiments disclosed while referring to FIGS. 1–6, a suitable interface (e.g. a Serial ATA, parallel ATA, SCSI, Serial Attached SCSI, or the like) and a serial-to-parallel bridge are located on the removable carrier or the U-shaped receiving frame so that the receiving frame is adapted to automatically and interchangeable receive different removable drive carriers having remote computer drives that are connected for either serial or parallel operation. Despite the elimination of the U-shaped receiving frame in the embodiment represented by FIGS. 7–9, the same removable carriers having respective computer drives that are connected in different (e.g. serial or parallel) drive configurations are now interchangeably received by the same connectors 76 at the front of the backplane 74 surrounded by chassis 70 without having to make alterations to the drive, the chassis, or the backplane.

To achieve the advantage as just described, a serial-to-parallel bridge 84 (identical to that designated 62 in FIG. 6) is connected to the circuit board 85 mounted at the back wall of carrier 72. Depending upon how the pull-out peripheral circuit board 78 is interfaced with hardware that is external to chassis 70, either a serial-to-serial or a serial-to-parallel converter (represented by integrated circuit chips 86) is connected to the circuit board 78 which is detachably connected to the rear of backplane 74. By way of particular example, the converter 86 may be any one of a well known SCSI-to-serial, iSCSI-to-serial, fiber channel-to-serial, or the like, converter. A conventional RAID controller may also be used to perform the function of converter 86.

By virtue of the present invention, the means by which different removable carriers are able to be automatically interchangeable with one another within the same chassis or storage enclosure can reside on the removable carrier, the U-shaped receiving frame (if present), or the peripheral circuit board (with the receiving frame absent), so as to maximize the flexibility and efficiency of a computer system within which the remote computer drives of the carriers are interconnected with a host computer.

We claim:

1. A universal receiving frame to be located within an enclosure that is interfaced with a computer, said receiving frame receiving a removable carrier within which is connected a computer drive to store computer information, and said receiving frame adapted to interchangeably receive different removable carriers having different computer drives that are respectively connected for series and parallel operation with other computer drives in said enclosure, said universal receiving frame communicating with a serial-to-parallel bridge circuit adapted to convert the output of a parallel connected computer drive to a serial output, and said serial-to-parallel bridge circuit communicating with an interface for enabling the outputs of both serial and parallel connected computer drives to be supplied to the computer.

2. The universal receiving frame recited in claim 1, wherein said interface is selected from a group of interfaces consisting of Serial ATA, parallel ATA, SCSI and Serial Attached SCSI.

3. The universal receiving frame recited in claim 1, wherein said receiving frame includes a back wall, a pair of side walls, and a front for receiving different removable carriers therewithin, said serial-to-parallel bridge circuit and said interface being located at the back wall of said receiving frame.

4. The universal receiving frame recited in claim 1, wherein said serial-to-parallel bridge circuit is mounted on each of said parallel connected removable carriers to be interchangeably received by said receiving frame.

5. The universal receiving frame recited in claim 3, wherein said receiving frame also includes a printed circuit board mounted on said back wall thereof, said serial-to-parallel bridge circuit and said interface being located on said printed circuit board at said back wall.

6. The universal receiving frame recited in claim 5, wherein said serial-to-parallel bridge circuit is an integrated circuit chip that is electrically connected to said printed circuit board at the back wall of said receiving frame.

7. The universal receiving frame recited in claim 5, wherein said receiving frame also includes a multi-pin backplane connector located at said back wall and electrically connected to the printed circuit board, said multi-pin backplane connector at said back wall being sized and positioned to be mated to the backplane interface connector of the removable carrier received by said receiving frame.

8. A universal receiving frame to be located within an enclosure that is interfaced with a computer, said receiving frame receiving a removable carrier having either a serial or a parallel connected computer drive to store computer information, said receiving frame having a back wall, a pair of side walls, a front for receiving the removable carrier therewithin, a printed circuit board mounted on said back wall, a serial-to-parallel bridge circuit, and an interface communicating with said serial-to-parallel bridge circuit, said serial-to-parallel bridge circuit electrically connected to the printed circuit board at said back wall and automatically converting the output of a parallel connected computer drive to a serial output, and said interface electrically connected to the printed circuit board at said backwall for enabling the outputs of both serial and parallel connected computer drives to be supplied to the computer, whereby said receiving frame is adapted to interchangeably receive within said enclosure different removable carriers having respective computer drives that are connected for serial and parallel operation.

9. A universal receiving frame to be located within an enclosure that is interfaced with a computer, said receiving frame receiving a removable carrier having either a serial or a parallel connected computer drive to store computer information, a serial-to-parallel bridge circuit mounted on said removable carrier, and an interface mounted on said receiving frame and communicating with said serial-to-parallel bridge circuit, said serial-to-parallel bridge circuit automatically converting the output of a parallel connected computer drive to a serial output, and said interface enabling the outputs of both serial and parallel connected computer drives to be supplied to the computer, whereby said receiving frame is adapted to interchangeably receive within said enclosure different removable carriers having respective computer drives that are connected for serial and parallel operation.

10. In combination:

an enclosure to be interfaced with a computer;

a backplane located within said enclosure;

at least one removable carrier having either a serial or a parallel connected computer drive to store computer information, said removable carrier detachably connected at one side of said backplane;

at least one removable circuit board detachably connected to the opposite side of said backplane to be interconnected with the computer drive of said removable carrier;

a serial-to-parallel bridge to convert the output of a parallel connected computer drive to a serial output; and one of a serial-to-serial or a serial-to-parallel converter communicating with said serial-to-parallel bridge for enabling both serial and parallel connected computer drives to communicate with the computer;

whereby said backplane is adapted to be interchangeably connected within said enclosure to different removable carriers having respective computer drives that are connected for serial and parallel operation.

11. The combination recited in claim 10, wherein said serial-to-parallel bridge is mounted on said removable carrier.

12. The combination recited in claim 10, wherein said converter is mounted on said removable circuit board.

13. The combination recited in claim 10, wherein said converter is selected from a group of converters consisting of SCSI-to-serial, iSCSI-to-serial, and fiber channel-to-serial.

* * * * *